United States Patent
Liu et al.

(10) Patent No.: US 9,177,836 B1
(45) Date of Patent: Nov. 3, 2015

(54) PACKAGED INTEGRATED CIRCUIT DEVICE HAVING BENT LEADS

(71) Applicants: Peng Liu, Tianjin (CN); Qingchun He, Tainjin (CN); Ping Wu, Tianjin (CN)

(72) Inventors: Peng Liu, Tianjin (CN); Qingchun He, Tainjin (CN); Ping Wu, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/554,065

(22) Filed: Nov. 26, 2014

(30) Foreign Application Priority Data

Jun. 6, 2014 (CN) .......................... 2014 1 0338546

(51) Int. Cl.
*H01L 23/495* (2006.01)
*H01L 21/56* (2006.01)

(52) U.S. Cl.
CPC .................................... *H01L 21/565* (2013.01)

(58) Field of Classification Search
CPC ............................................ H01L 2224/48247
USPC ............................................................ 257/666
See application file for complete search history.

(56) References Cited

U.S. PATENT DOCUMENTS

| | | |
|---|---|---|
| 5,616,953 A | 4/1997 | King |
| 6,319,753 B1 | 11/2001 | Ichikawa |
| 6,977,431 B1 | 12/2005 | Oh |
| 7,109,586 B2 | 9/2006 | Batish |
| 8,093,694 B2 | 1/2012 | Ong |
| 8,609,468 B2 | 12/2013 | Fujisawa |

*Primary Examiner* — Anthony Ho
(74) *Attorney, Agent, or Firm* — Charles Bergere (57) ABSTRACT

A method for assembling a quad flat no-lead (QFN) device includes mounting and electrically connecting a die to a pre-plated lead frame (PPF) to form a sub-assembly, where the plating is solder-wettable and the lead frame has notches in the lead fingers located along the device boundary. The sub-assembly is then encapsulated to (1) leave the distal ends of the lead fingers exposed and (2) have the edge of the encapsulant adjacent to the notches. The sub-assembly is then singulated to leave distal lead segments protruding from the resulting device. The protruding exposed segments are then bent to be substantially parallel to the device sidewalls. Consequently, the plated surface of each lead extends along portions of both the bottom and one side of the device.

7 Claims, 6 Drawing Sheets

PACKAGED INTEGRATED CIRCUIT DEVICE HAVING BENT LEADS

BACKGROUND OF THE INVENTION

The present invention relates to packaging integrated circuit (IC) devices and, more particularly, to a Quad Flag No leads (QFN) type device with bent leads.

QFN devices have leads that do not extend out from the device edge. That is, the leads or device contacts are generally flush with the package body. One type of QFN device is a power QFN (PQFN), which includes an exposed die paddle at the bottom of the device for more-efficient heat dissipation from the die. Note that flat no-lead devices are also known as micro lead frame (MLF) devices, micro lead frame packaged (MLP) devices, or small outline no-leads (SON) devices.

Figure 1A:
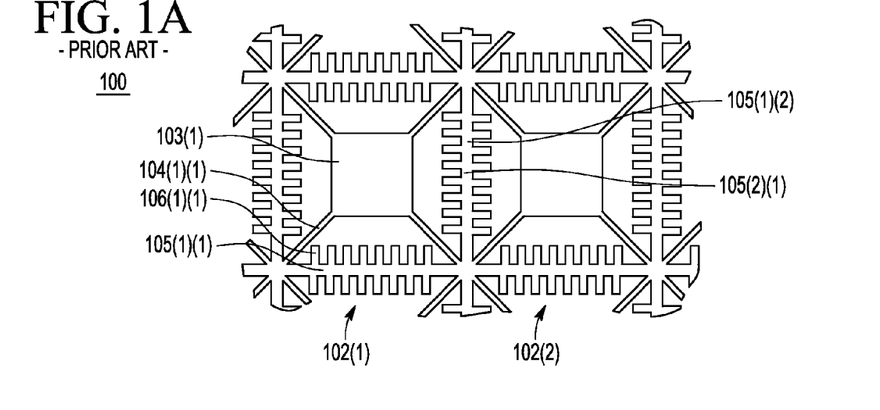
FIG. 1A is a top plan view of partial segment of a lead frame array.
Figure 1B:
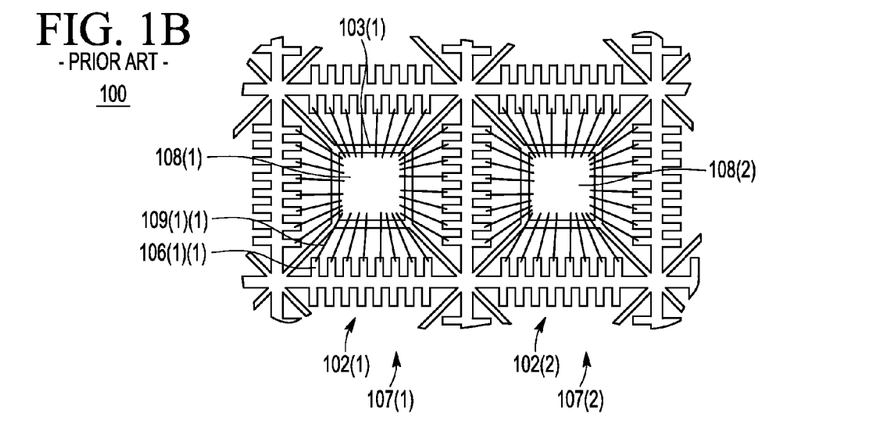
FIG. 1B is a top plan view of the partial segment of FIG. 1A, following (1) the mounting of dies to the die paddles of the lead frames and (2) the electrical connection of the dies to corresponding lead fingers using wire bonds.
Figure 1C:
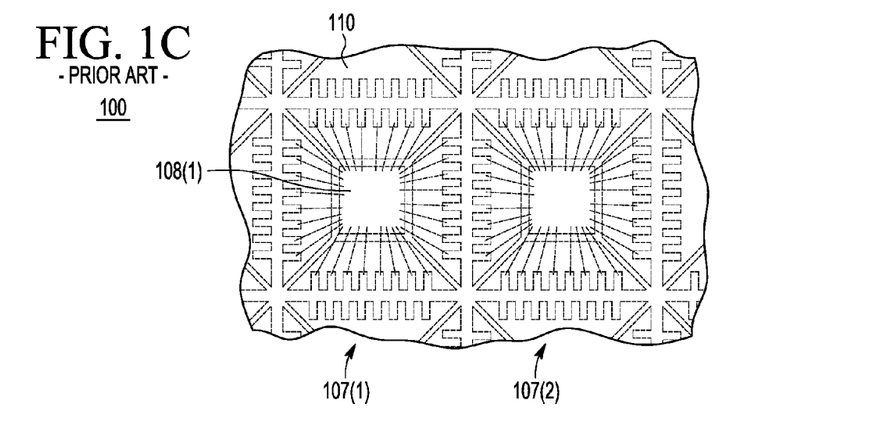
FIG. 1C is a top plan view of the partial segment of FIG. 1B, following the encapsulation of the sub-assemblies with an encapsulant.
Figure 1D:
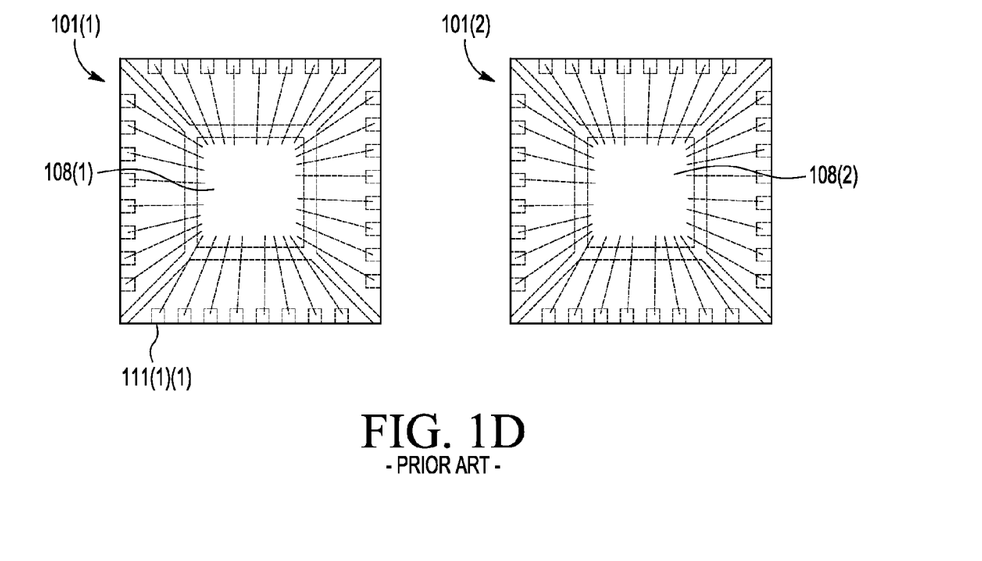
FIG. 1D is a top plan view of one of the chips resulting from the singulation of the sub-assemblies of FIG. 1C.

FIGS. 1A-1F show steps in the assembly of a conventional QFN device 101(1) (FIG. 1D). The assembly process includes die mounting, wire bonding, encapsulation, and singulation. Note that, conventionally, multiple devices 101 are simultaneously assembled. As used herein and unless otherwise indicated, the terms device and chip refer to a singulated, packaged IC die.

FIG. 1A shows a top plan view of partial segment 100 of a lead frame array. The lead frame array is in the form of a two-dimensional array having a number of rows and the same or a different number of columns of attached lead frames outlined by a grid, including lead frames 102(1) and 102(2). The segment 100 includes lead frames 102(1) and 102(2) and portions of adjoining lead frames of the lead frame array. The lead frame array is typically stamped from a metal sheet.

Each lead frame in the array may be a pre-plated frame (PPF), which comprises a copper core plated with a metal finish comprising, for example, nickel, palladium, lead, tin, gold, and/or silver. The plated finish is solder-wettable, where a material's solder-wettability refers to the ease of adhesion of molten solder to the material. In other words, during surface mounting, molten solder adheres easily to the plating on the lead frame.

The lead frame 102(1) comprises corresponding paddle 103(1), tie bars 104(1)—such as exemplary tie bar 104(1)(1), support bars 105(1)—such as exemplary support bars 105(1)(1) and 105(1)(2), and lead fingers 106(1)—such as exemplary lead finger 106(1)(1).

Each lead frame 102 comprises (i) four tie bars 104 supporting the die paddle 103 to the intersections of support bars 105, (ii) four support bars 105, which support the lead fingers 106 and also define the grid of the lead frame array, and (iii) 32 lead fingers 106, eight on each of the lead frame's 102 four support bars 105. Note that support bars are sometimes referred to as dam bars. The support bars 105 that are in the interior of the array—in other words, support bars that are not on the periphery of the lead frame array—are shared by adjacent lead frames 102. For example, support bar 105(1)(2) is shared by lead frames 102(1) and 102(2) and, as a result, may also be referred to as support bar 105(2)(1) of lead frame 102(2). IC dies are subsequently mounted onto die paddles 103 and electrically connected to the lead fingers 106 with a wire bonding process.

FIG. 1B shows a top plan view of the partial segment 100 comprising sub-assemblies 107(1) and 107(2), following (1) the mounting of dies 108 to the die paddles 103 of the lead frames 102 of sub-assemblies 107 and (2) the electrical connection of the dies 108 to corresponding lead fingers 106 using wire bonds 109. For example, sub-assembly 107(1) comprises die 108(1) mounted to paddle 103(1) of lead frame 102(1) and electrically connected to lead fingers 106(1)—such as lead finger 106(1)(1)—using corresponding bond wires 109(1)—such as bond wire 109(1)(1), which connects lead finger 106(1)(1) to a corresponding bond pad (not shown) on the top surface of the die 108(1). The die 108(2) is similarly mounted and wire-bonded to the lead frame 102(2) of the sub-assembly 107(2). The sub-assemblies 107 of the lead frame array are then encapsulated.

FIG. 1C shows a top plan view of the partial segment 100 of FIG. 1B, comprising sub-assemblies 107(1) and 107(2), following the encapsulation of the sub-assemblies 107 with an encapsulant 110. The encapsulant 110 may be, for example, an epoxy molding compound. The top surface of the sub-assemblies 107 comprises the encapsulant 110. Other components of the sub-assemblies 107 are shown as hidden features in FIG. 1C. Next, the sub-assemblies 107 are singulated.

FIG. 1D shows a top plan view of one of the devices 101 resulting from the singulation of the sub-assemblies 107 of FIG. 1C—such as corresponding sub-assemblies 107(1) and 107(2). The array comprising partial segment 100 of FIG. 1C may be singulated or diced by, for example, a laser or a saw. The singulation may include grinding in addition to the cutting. Aside from separating the sub-assemblies 107, the singulation process removes the support bars 105 around chips 101 and portions of the lead fingers 106—including the corresponding segments of encapsulant 110—leaving behind corresponding leads 111, such as exemplary lead 111(1)(1) that corresponds to lead finger 106(1)(1) of FIG. 1B.

Figure 1E:
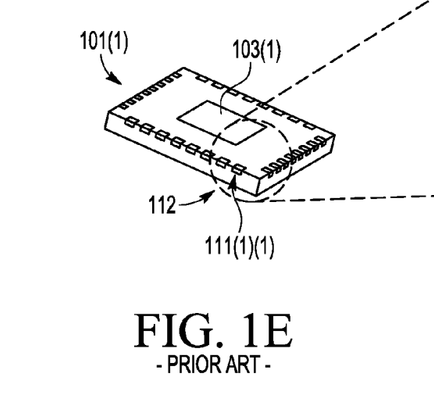
FIG. 1E is a perspective view of the chip of FIG. 1D.

FIG. 1E shows a perspective view of the device 101(1) of FIG. 1D, where the device 101(1) has been flipped over showing its bottom and two sides. Die paddle 103(1) is exposed. Each of leads 111(1) has two exposed surfaces that are flush with the surfaces of the device 101(1)—i.e., a bottom surface and a side surface. Detail area 112 includes the exposed surfaces of lead 111(1)(1).

Figure 1F:
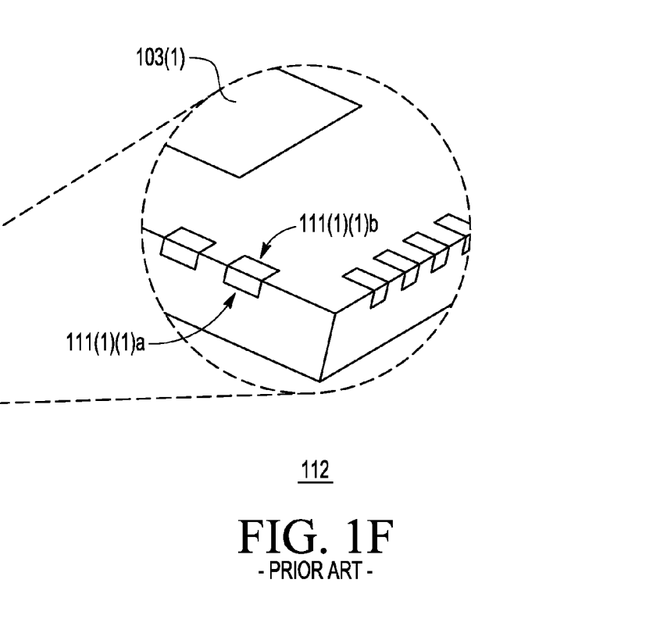
FIG. 1F is an enlargement of the detail area of FIG. 1E.

FIG. 1F shows an enlargement of the detail area 112 of FIG. 1E. The exposed surfaces of each lead 111(1), such as lead 111(1)(1), include a lead side surface 111(1)a, such as side surface 111(1)(1)a, and a lead bottom surface 111(1)b, such as bottom surface 111(1)(1)b. Each bottom surface 111(1)b is plated with the above-described plating finish, as is the bottom surface of the die paddle 103(1). Side surface 111(1)a, however, is mostly the copper core of the lead frame 102(1) of FIG. 1A. Copper is not solder-wettable. As a result, during mounting, molten solder will adhere to bottom surfaces 111(1)b, which are plated with solder-wettable plating, but not to the side surfaces 111(1)a, which are not plated.

BRIEF DESCRIPTION OF THE DRAWINGS

Other aspects, features, and advantages of the invention will become more fully apparent from the following detailed description, the appended claims, and the accompanying drawings in which like reference numerals identify similar or identical elements. Note that elements in the figures are not necessarily drawn to scale.

FIGS. 1A-1F show steps in the assembly of a conventional QFN device, where

FIGS. 2A-2F show steps in the assembly of an exemplary QFN chip of FIG. 2F in accordance with one embodiment of the invention;

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures.

Improving the wettability of the side walls of no-lead chips may improve the electrical and/or physical quality of attachments of the chips to corresponding PCBs.

In one embodiment, after mounting and wire-bonding dies to corresponding pre-plated lead frames of a lead frame array, the lead frames are packaged and singulated so that leads protrude out from the sides of the resulting chips and the protrusions are bent up against the sidewalls of the chips so that the sidewalls of the chip have lead surfaces that are plated with solder-wettable plating. Note that the bending may also be referred to as folding.

Figure 2A:
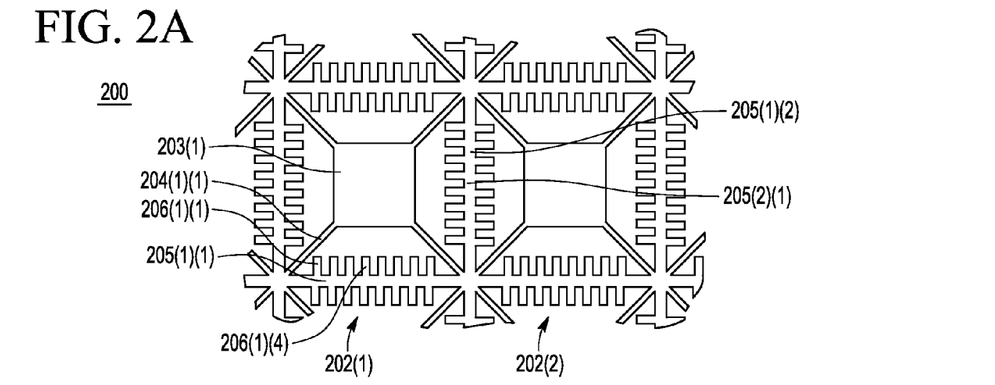
FIG. 2A shows a top plan view of a partial segment of a lead frame array.
Figure 2B:
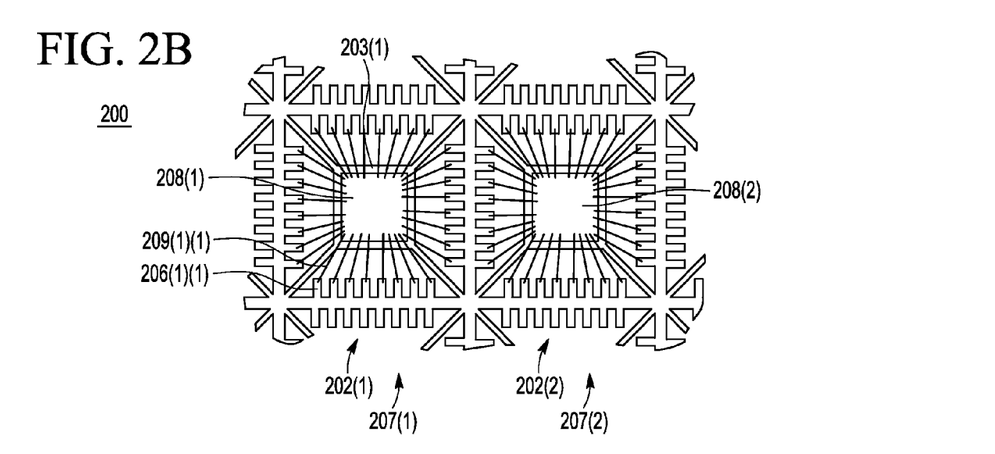
FIG. 2B shows a top plan view of the partial segment of FIG. 2A, following (1) the mounting of dies to the die paddles of the lead frames and (2) the electrical connection of the dies to corresponding lead fingers using wire bonds.
Figure 2C:
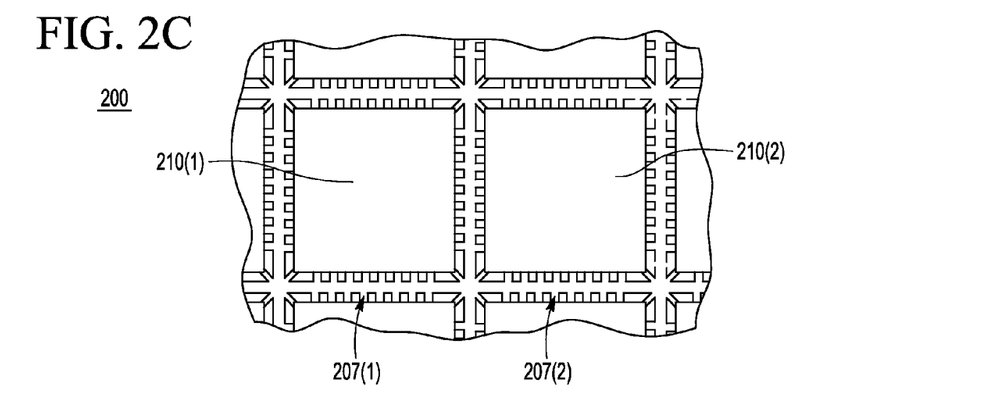
FIG. 2C shows a top plan view of the partial segment of FIG. 2B, following the encapsulation of the sub-assemblies with an encapsulant.
Figure 2D:
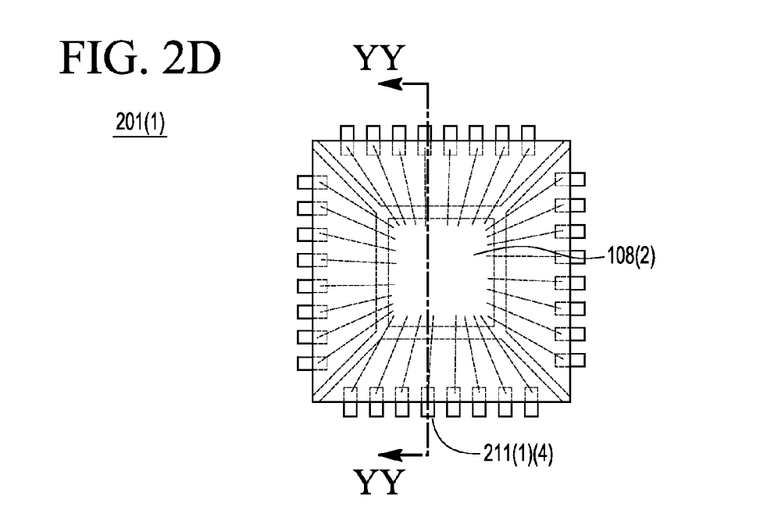
FIG. 2D shows a top plan view of a chip resulting from the singulation of a sub-assembly of FIG. 2C.
Figure 2E:
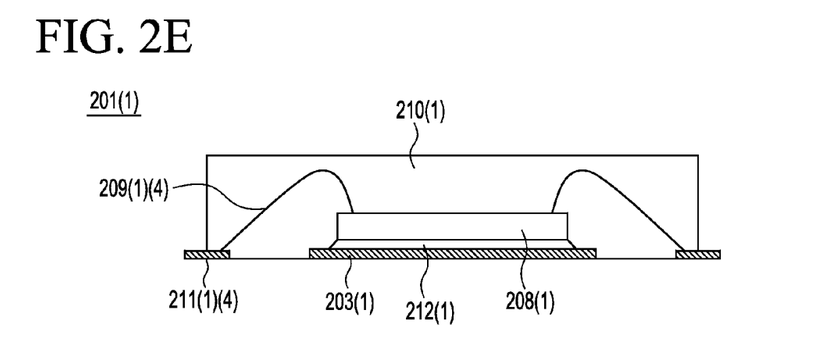
FIG. 2E shows an enlarged, simplified cross-sectional view of the chip of FIG. 2D along cut line YY-YY.
Figure 2F:
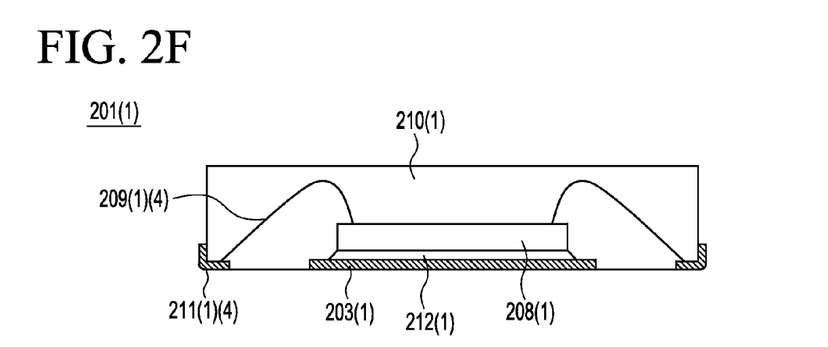
FIG. 2F shows a simplified side cross-sectional view of the chip of FIG. 2E after bending.

FIGS. 2A-2F show steps in the assembly of an exemplary QFN chip 201(1) of FIG. 2F in accordance with one embodiment of the invention. The assembly process includes die mounting, wire bonding, encapsulation, and singulation.

FIG. 2A shows a top plan view of a partial segment 200 of a lead frame array in the form of a two-dimensional array having a number of rows and the same or a different number of columns of attached lead frames outlined by a grid, including lead frames 202(1) and 202(2). Segment 200 includes lead frames 202(1) and 202(2) and portions of adjoining lead frames. Each lead frame in the array is a pre-plated frame (PPF), which comprises a core made of a first metal composition—such as, for example, copper—plated with a metal finish made of a second metal composition different from the first metal and solder wettable. The second metal composition may include, for example, nickel, palladium, lead, tin, gold, and/or silver.

Lead frame 202(1) comprises corresponding paddle 203(1), tie bars 204(1)—such as exemplary tie bar 204(1)(1), support bars 205(1)—such as exemplary support bars 205(1)(1) and 205(1)(2), and lead fingers 206(1)—such as exemplary lead fingers 206(1)(1) and 206(1)(4).

Each lead frame 202 comprises (i) four tie bars 204 supporting the die paddle 203 to support-bar intersections, (ii) four intersecting support bars 205, which hold the lead fingers 206 and also define the grid of the lead frame array, and (iii) a plurality of lead fingers 206, a subset on each of the lead frame 202's four support bars 205. Support bars 205 that are in the interior of the array are shared by adjacent lead frames 202. For example, support bar 205(1)(2) may also be referred to as support bar 205(2)(1) of lead frame 202(2). IC dies are subsequently mounted onto the die paddles 203 and wire bonded to the lead fingers 206.

FIG. 2B shows a top plan view of the partial segment 200 of FIG. 2A, comprising sub-assemblies 207(1) and 207(2), following (1) the mounting of dies 208 to the die paddles 203 of the lead frames 202 of sub-assemblies 207 and (2) the electrical connection of the dies 208 to corresponding lead fingers 206 using wire bonds 209. For example, sub-assembly 207(1) comprises die 208(1) mounted to paddle 203(1) of lead frame 202(1) and electrically connected to lead fingers 206(1)—such as lead finger 206(1)(1)—using corresponding bond wires 209(1)—such as bond wire 209(1)(1), which connects lead finger 206(1)(1) to a corresponding bond pad (not shown) on the top surface of die 208(1). Die 208(2) is similarly mounted and wire-bonded to lead frame 202(2) of sub-assembly 207(2). The sub-assemblies 207 of the lead frame array are then encapsulated.

FIG. 2C shows a top plan view of the partial segment 200 of FIG. 2B, comprising sub-assemblies 207(1) and 207(2), following the encapsulation of the sub-assemblies 207 with an encapsulant 210. The encapsulant 210 is applied so as to leave exposed the distal portions of the lead fingers 206 of the sub-assembly 207—i.e., the portions of the lead fingers 206 away from the center of the sub-assembly 207. This may be achieved by, for example, using a corresponding molding tool to contain the molding compound or using a corresponding molding insert that is placed over the lead frame array. The support bars 205 and portions of the tie bars 204 are also left exposed. Sub-assembly 207(1) is encapsulated with encapsulant 210(1), while sub-assembly 207(2) is encapsulated with encapsulant 210(2). Next, the sub-assemblies 207 are singulated. The sub-assemblies are cut so as to leave behind chips with protruding leads.

FIG. 2D shows a top plan view of a chip 201(1) resulting from the singulation of sub-assembly 207(1) of FIG. 2C. Hidden features of chip 201, such as die 208(1), are shown with dashed lines. Leads 211(1), which correspond to lead fingers 206(1) of FIG. 200, protrude from the sides of chip 201(1). Exemplary lead 211(1)(4) corresponds to lead finger 206(1)(4) of FIG. 2A.

FIG. 2E shows an enlarged, simplified cross-sectional view of the chip 201(1) of FIG. 2D along cut line YY-YY. The view shows die 208(1) mounted to paddle 203(1) with die-attach material 212(1) and electrically connected to leads 211 via bond wires 209. Exemplary lead 211(1)(4) is electrically connected to die 208(1) via exemplary bond wire 209(1)(4). Each lead 211 includes (1) a covered proximate segment that is partially encapsulated by encapsulant 210 and (2) an exposed distal segment that is not encapsulated by encapsulant 210. Next, the protruding exposed segments of the leads 211 are bent up against the sides of the chip 201.

FIG. 2F shows a simplified side cross-sectional view of the chip 201(1) of FIG. 2E after the above-described bending. The exposed segment of exemplary lead 211(1)(4) is bent up against the sidewall of chip 201(1), as are the exposed segments of the other leads 211(1).

Figure 3A:
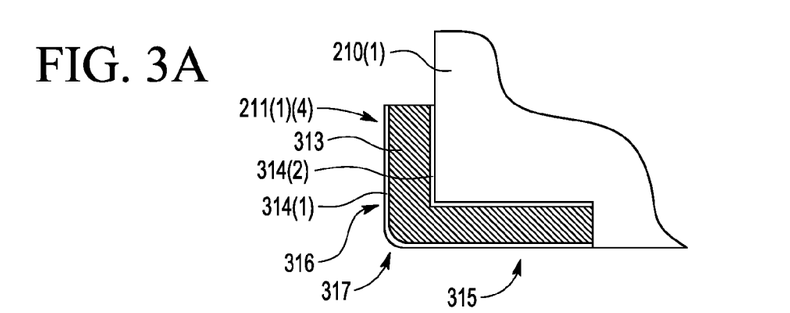
FIG. 3A shows a close-up view of the area around the exemplary lead of FIG. 2F.

FIG. 3A shows a close-up view of the area around the exemplary lead 211(1)(4) of FIG. 2F, whose exposed segment is bent up against encapsulant 210(1), which forms the sidewall of chip 201(1). Lead 211(1)(4) comprises (1) core 313, made up of a first metal, such as copper and (2) plating 314, made up of a different metal, such as, for example, a solder-wettable metal as described above. Note that, although lead 211(1)(4) is shown with (1) a plating portion 314(1) facing away from the encapsulant 210(1) and (2) a plating portion 314(2) on the side nearer chip 201(1) and facing the encapsulant 210(1), some embodiments have only the away-facing plating portion 314(1) and omit the in-facing plating portion 314(2). The in-facing plating portion 314(2) is not needed for soldering chip 201(1) to a corresponding PCB and may be present because of the means used to plate the corresponding lead frame.

Lead 211(1)(4) includes multiple segments, namely: (1) a transverse proximate segment 315 that is substantially parallel to the bottom of chip 201(1) and is partially encapsulated by encapsulant 210(1), (2) an upright exposed distal segment 316 that is bent up against the sidewall of chip 201(1), and (3) an exposed corner segment 317 connecting the transverse proximate segment 315 and the upright distal segment 316. The outer portions of upright, corner, and transverse segments of lead 211(1)(4) comprise the plating 314(1). Since plating 314(1) comprises a solder-wettable composition, solder will adhere to the upright, corner, and transverse segments to provide a larger contact area and, consequently, a stronger and more conductive bond than with the conventional QFN chip of FIGS. 1A-1F.

Figure 3B:
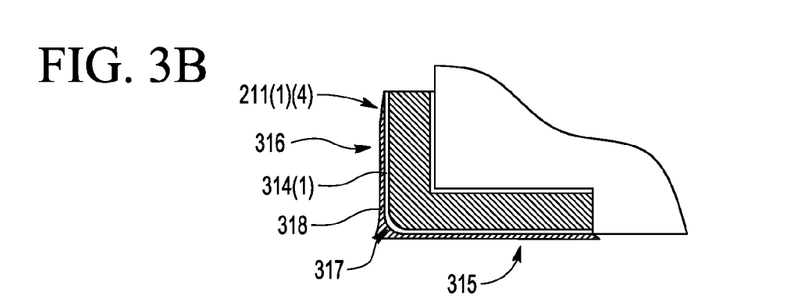
FIG. 3B shows the close-up of FIG. 3A after solder reflow.

FIG. 3B shows the close-up of FIG. 3A after solder reflow. Solder 318 has adhered to the plating 314(1) of transverse proximate segment 315, corner segment 317, and upright distal segment 316.

Figure 4A:
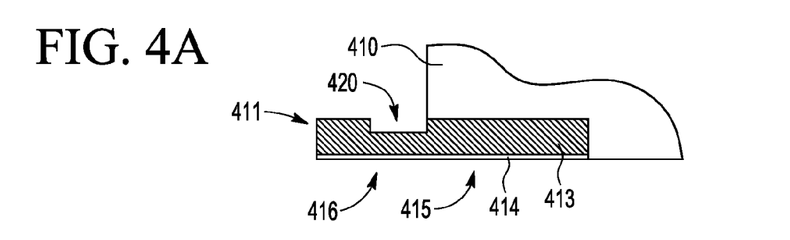
FIG. 4A shows a close-up of a side cross-sectional view of a lead, such as the exemplary lead of FIG. 2E, in accordance with another embodiment of the invention.

FIG. 4A shows a close-up of a side cross-sectional view of a lead 411—such as exemplary lead 211(1)(4) of FIG. 2E—in accordance with another embodiment of the invention. Lead 411 comprises core 413 made of a first metallic composition and plating 414 made of a second metallic composition that is different from the first composition and solder wettable. Lead 411 includes covered proximate segment 415, which is partially encapsulated by encapsulant 410, and exposed distal segment 416, which is not encapsulated by encapsulant 410. The top part of exposed segment 416 has a notch 420 making that portion of the lead 411 thinner than elsewhere along its length. The relative thinness of lead 411 in the portion having notch 420 allows for easier bending of the lead 411 in that portion of the lead 411, which will form the corner segment after bending.

Figure 4B:
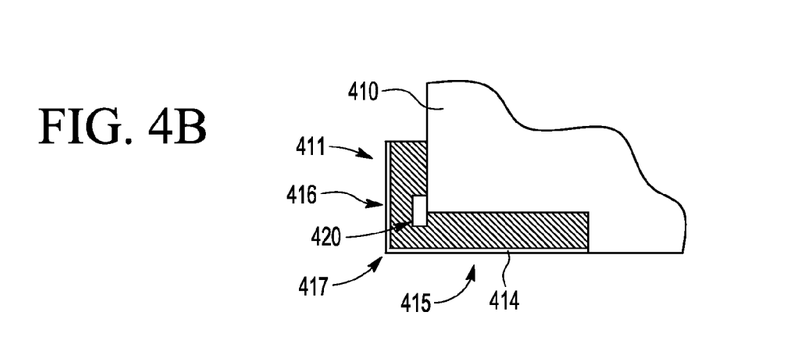
FIG. 4B shows a simplified view of the lead of FIG. 4A after bending at the portion corresponding to the notch.

Each of the other leads 411 of the chip is similarly notched in the portion of the lead that will form the corner segment after bending. In other words, the leads are thinner in the portion of the lead adjacent the edge of the encapsulant 410, which is the sidewall of the corresponding chip. The lead frame from which the leads—such as lead 411—are formed is notched, or otherwise thinned, during lead frame manufacture in the portions intended to form the corner segments. The notches or thinning may be achieved by, for example, stamping, etching, pressing, and/or grinding the lead frame arrays FIG. 4B shows a simplified view of the lead 411 of FIG. 4A after bending at the portion corresponding to the notch 420. Covered segment 415 became transverse proximate segment 415, which remains substantially parallel to the bottom of the corresponding chip. Exposed segment 416 became upright distal segment 416, which is now substantially perpendicular to the transverse segment 415 and substantially parallel to the sidewall of the corresponding chip. The portion of lead 411 having notch 420 became the corner segment 417. The presence of the solder-wettable plating 414 along the corner segment 417 and the upright distal segment 416—as well as transverse proximate segment 415—will allow for a larger solder contact area with lead 411 compared to conventional leads, thereby making for a stronger and more conductive bond.

Embodiments of the invention have been described where the lead's corner-segment notch extends out from the edge of the encapsulant away from the chip. In some alternative embodiments, the notch may extend both inward and outward from the edge of the encapsulant.

Figure 5A:
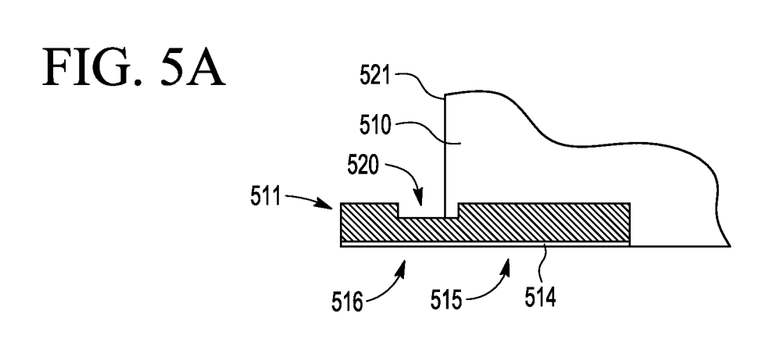
FIG. 5A shows a close-up of a side cross-sectional view of a lead, such as the exemplary lead of FIG. 2E, in accordance with an alternative embodiment of the invention.

FIG. 5A shows a close-up of a side cross-sectional view of a lead 511—such as the exemplary lead 211(1)(4) of FIG. 2E—in accordance with an alternative embodiment of the invention. The elements of FIG. 5A are substantially similar to the elements of FIG. 4A and corresponding elements are similarly labeled but with a different prefix. Notch 520 extends both inwards and outwards from the edge 521 of molding compound 510.

Figure 5B:
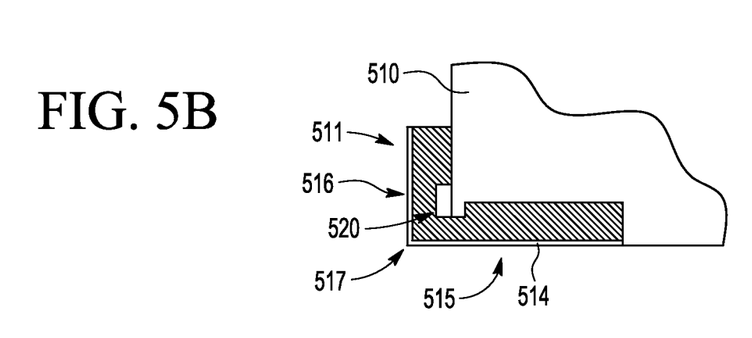
FIG. 5B shows a simplified view of the lead of FIG. 5A after bending at the portion corresponding to the notch.

FIG. 5B shows a simplified view of the lead 511 of FIG. 5A after bending at the portion corresponding to the notch 520. The elements of FIG. 5B are substantially similar to the elements of FIG. 4B and corresponding elements are similarly labeled but with a different prefix. The presence of the solder-wettable plating 514 along the corner segment 517 and the upright distal segment 516—as well as transverse proximate segment 515—will allow for a larger solder contact area with lead 511 compared to conventional leads, thereby making for a stronger and more conductive bond.

Embodiments of the invention have been described where the die of a QFN device is wire-bonded to the lead frame during assembly. In alternative embodiments, the die is, instead, ball bonded to a corresponding lead frame of a QFN device.

Embodiments of the invention have been described where, following encapsulation, the support bars are left exposed. In alternative embodiments, the support bars are encapsulated, but distal portions of the lead fingers remain exposed.

Embodiments of the invention have been described where each lead of the chip is electrically connected to the die. It should be noted that, in some embodiments, one or more leads may be floating leads that are not electrically connected to the die. This may happen, for example, if mounting a die to a lead frame that has more leads than needed for the die's bond pads.

Embodiments of the invention have been described where, after bending, the upright distal segment of the lead is substantially perpendicular—i.e., at angle of 90°+/−10°—to the transverse proximate segment of the lead. It should be noted, however, that the degree of bending is not limited to the perpendicular. In some embodiments, the chip sidewalls may be tapered inwards or outwards and, consequently, the leads may be bent to be substantially parallel to the sidewalls. In one embodiment, the sidewalls of the chip may be tapered inward at an angle of 45° and the leads may be, as a result, bent upwards through a corresponding arc of 135°+/−10° to form an angle of 45°+/−10°. In some embodiments, the upright distal segments may be bent upwards but not to the degree to become substantially parallel to the sidewalls of the corresponding chip.

Embodiments of the invention have been described where the lead frames are notched or otherwise thinned in the portion that will eventually be the corner segment during lead frame manufacture. In some embodiments, the lead frame or its leads may be notched or otherwise thinned during assembly, by for example, any of the above-mentioned methods.

Embodiments of the invention have been described where the chip assembly is performed on a lead frame array. The invention is not, however, so limited. In alternative embodiments, the mounting of the die and subsequent assembly steps are performed on a single unattached lead frame.

Embodiments of the invention have been described wherein the lead frame is pre-plated prior to mounting, bonding, and encapsulation. In some alternative embodiments, the lead frames are not pre-plated. Rather, un-plated lead frames are used during mounting, bonding, and encapsulation. The exposed portions of the lead fingers are then plated after encapsulation. This alternative method of plating reduces the amount of plating material used.

It will be further understood that various changes in the details, materials, and arrangements of the parts which have been described and illustrated in order to explain the nature of this invention may be made by those skilled in the art without departing from the scope of the invention as expressed in the following claims.

A lead frame is a collection of metal leads and possibly other elements (e.g., die paddles, power bars) that is used in semiconductor packaging for assembling a single packaged semiconductor device. Prior to assembly into a packaged device, a lead frame may have support structures (e.g., a rectangular metal frame) that keep those elements in place. During the assembly process, the support structures may be removed. As used herein, the term "lead frame" may be used to refer to the collection of elements before assembly or after assembly, regardless of the presence or absence of those support structures.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

The use of figure numbers and/or figure reference labels in the claims is intended to identify one or more possible embodiments of the claimed subject matter in order to facilitate the interpretation of the claims. Such use is not to be construed as limiting the scope of those claims to the embodiments shown in the corresponding figures.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

The invention claimed is:

1. A packaged integrated circuit (IC) device having a top, a bottom, and multiple sides, the IC device comprising:
    an IC die;
    an encapsulant that covers at least part of the die; and
    a plurality of leads electrically connected to the die;
    wherein each of the leads comprises:
        a core having a first composition; and
        a plating having a second composition different from the first composition; and
    each of the leads includes:
        a transverse segment that is partially covered by the encapsulant, leaving at least a first portion of the plating exposed and forming part of the bottom of the IC device; and
        an upright segment that is not covered by the encapsulant and is bent upwards so that a second portion of the plating is exposed and forms part of one of the sides of the IC device.

2. The device of claim 1, wherein:
the first composition is not solder wettable; and
the second composition is solder wettable.

3. The device of claim 1, wherein:
the first composition comprises copper; and
the second composition comprises at least one of: nickel, palladium, lead, tin, gold, and silver.

4. The device of claim 1, wherein a portion of the plating of each lead faces the encapsulant.

5. The device of claim 1, wherein each lead comprises a notch forming a corner segment located between the exposed upright segment and the transverse segment.

6. The device of claim 1, wherein the upright segment is at angle of 90°+/−10° to the transverse segment.

7. The device of claim 1, wherein the upright segment is at an angle of 45°+/−10° to the transverse segment.

* * * * *